United States Patent
Du et al.

(10) Patent No.: US 6,768,763 B1
(45) Date of Patent: Jul. 27, 2004

(54) RESONATOR SYSTEM WITH AT LEAST TWO FOLDING ELEMENTS

(75) Inventors: Keming Du, Aachen (DE); Peter Loosen, Aachen-Kornelimuenster (DE); Reinhart Poprawe, Aachen (DE); Konstantin Boucke, Aachen (DE)

(73) Assignee: Fraunhofer-Gesellschaft zur Foerderung der Angewandten Forschung, E.V., Munich (DE)

( * ) Notice: Subject to any disclaimer, the term of this patent is extended or adjusted under 35 U.S.C. 154(b) by 0 days.

(21) Appl. No.: 09/913,115

(22) PCT Filed: Feb. 9, 2000

(86) PCT No.: PCT/EP00/01041
§ 371 (c)(1),
(2), (4) Date: Sep. 6, 2001

(87) PCT Pub. No.: WO00/48277
PCT Pub. Date: Aug. 17, 2000

(30) Foreign Application Priority Data

Feb. 9, 1999 (DE) ........................................ 199 05 218

(51) Int. Cl.[7] .............................. H01S 3/08; H01S 5/00
(52) U.S. Cl. ............................................ 372/93; 372/46
(58) Field of Search .............................. 372/92, 93, 94, 372/43–50, 99

(56) References Cited

U.S. PATENT DOCUMENTS 3,883,888 A 5/1975 Kressel et al. ................ 257/96
5,231,642 A 7/1993 Scifres et al. ................. 372/45
6,542,529 B1 * 4/2003 Hagberg et al. ............... 372/46

FOREIGN PATENT DOCUMENTS

| EP | 0533390 | 3/1993 |
| FR | 2739982 | 4/1997 |
| JP | 56073485 | 6/1981 |
| JP | 05167197 | 7/1993 |

OTHER PUBLICATIONS

B. Pezeshki, J.A. Kash, D.W. Kisker and F. Tong, "Multiple Wavelength Light Source Using an Asymmetric Waveguide Coupler", Applied Phys. Lett., vol. 65, No. 2 Jul. 11, 1994, pp. 138–140.

* cited by examiner

*Primary Examiner*—Quyen Leung
(74) *Attorney, Agent, or Firm*—Milde & Hoffberg, LLP

(57) ABSTRACT

The invention relates to a resonator system with at least two folding elements for folding the beam path. Said folding elements serve to restrict the divergence angle of the radiation. The inventive resonator system is further characterized in that the respective folding is caused by reflection on a reflecting surface of the respective folding element. The beam axis of the radiation and the surface normal of the respective reflecting area are positioned at an angle relative to each other that is greater than the critical angle for the total reflection but smaller than the sum of the critical angle for the total reflection plus the divergence angle of the radiation.

13 Claims, 10 Drawing Sheets

RESONATOR SYSTEM WITH AT LEAST TWO FOLDING ELEMENTS

BACKGROUND OF THE INVENTION

The present invention relates to a resonator arrangement comprising at least two folding elements for folding the beam path, the folding elements serving to restrict the divergence angle of the radiation.

The simplest optical resonator is the so-called Fabry resonator which consists of mirrors arranged in parallel with one another. The beam that is incident on the mirror in vertical direction is reflected back and forth without any directional change between the two mirrors that are arranged in plane-parallel fashion. When a gain or amplification medium is placed between the two resonator mirrors, the beam can be highly amplified. It is coupled out through one of the two mirrors that is made partially transmissive for this purpose. Other rays impinging on the resonator mirrors in a direction other than the one of vertical incidence are reflected out of the resonator after a few passes or travels. As a result, the beam vertically impinging on the resonator mirrors experiences a maximum gain. As a consequence, this beam prevails over the other rays. The resonator thereby selects the beam perpendicular to the mirrors because of the higher gain.

In practice, there are many different types of lasers in which media are used with different characteristics for amplification or gain. For instance, there are laser media with a low gain factor, such as Cr:LiSaF, and laser media with an extremely high gain factor, as e.g. in the case of the diode laser. For laser media with a low gain factor, high-quality resonators must be constructed to ensure an efficient laser operation. In such a case a resonator which consists of two mirrors is often adequate for achieving the necessary mode selection.

The diode laser, on the other hand, has an extremely high gain factor. To achieve a high efficiency, a large part of the radiation traveling in the resonator must be coupled out. For instance, the resonator of a semiconductor laser typically consists of an end mirror having a reflection of about 95% and an output coupler with a reflection of about 5%. In addition, there is a high gain in comparison with conventional lasers. As a consequence, the resonator quality is minimum and the mode selecting capacity is therefore low. This means that modes of a low beam quality are also created.

An enhanced mode selection can e.g. be achieved by way of an aperture. There are in principle two different types of apertures: mode apertures on the one hand and soft gain apertures (gain guiding) on the other hand.

For an enhanced mode selection in diode lasers, use is made in U.S. Pat. No. 5,231,642 of periodic grating structures or distributed reflection structures. The structure used can be produced by way of a photolithographic process. The function of the periodic grating structures or of the distributed reflection structures consists in enhancing the mode selecting capacity on the one hand and in reducing filamentation on the other hand. The reflection on the grating structures, as are known from U.S. Pat. No. 5,231,642, is based on constructional interference according to the Bragg principle. As a rule, such gratings or grating structures are difficult to manufacture; there are great losses on the boundary surfaces, in particular in the case of an inaccurate manufacture; these may result in relatively large subassemblies, and finally gratings show a wavelength dependence on the reflection characteristics.

SUMMARY OF THE INVENTION

Starting from the above-described prior art, it is the object of the present invention to indicate a resonator arrangement by which the divergence angle of the radiation can be changed or reduced within the resonator arrangement independently of the wavelength.

This object is achieved in a resonator arrangement of the above-mentioned type in that the respective folding is caused by reflection on a reflecting surface of the respective folding element, the beam axis of the radiation and the surface normal of the respective reflecting surface being positioned at an angle relative to each other that is greater than the critical angle for the total reflection but smaller than the sum of the critical angle for the total reflection plus the divergence angle of the radiation.

Such an arrangement is characterized in that a strongly angle-dependent reflection degree is created on the whole so that the divergence angle of the radiation traveling in the resonator of such a design is limited without the need for resorting to the Bragg reflection on a grating having the above-mentioned drawbacks.

In a preferred development of the resonator arrangement, the respective reflecting surface is formed by the boundary surface between materials having different refractive indices. This arrangement is particularly suited for solid-state lasers having a glass-like or crystalline gain medium and for semiconductor lasers.

Furthermore, it is of advantage that in the resonator arrangement the waves are guided in part by a waveguide structure and that the respective reflecting surface is formed by changing the profile of the waveguide structure. Such an arrangement should always be used when e.g. the height of the waveguide profile can be varied in a simple way. For example, the waves are guided in semiconductor lasers in vertical direction by a layer structure which is designed as a waveguide. The waveguide profile can be changed in this instance by etching away upper layers.

To achieve a compact structure and a radiation which is only coupled out in one direction—also without a reflecting coating of a resonator end surface, at least the folding elements are arranged with respect to one another such that a resonator end mirror and a resonator output coupler are positioned in one plane.

In a further preferred embodiment, at least one of the folding elements of the resonator arrangement are provided with a plane-parallel layer which is partially transparent for the radiation. This partially transparent plane-parallel layer should here be constructed such that part of the impinging radiation is guided in this layer in the manner of a waveguide and the radiation is thus transported in a direction transverse to the preferred propagation direction of the radiation. This can contribute to a homogenization of the radiation field.

Preferably, the gain region is designed such that it only occupies part of the resonator volume formed by simple or multiple folding.

To avoid the formation of undesired radiation distributions, the regions which are positioned within the resonator volume and are not designed as a gain zone are provided with an additional absorption.

In a preferred variant of the resonator arrangement, a gain zone is provided which is layered, folding being performed in a plane perpendicular to the layer. Such a resonator arrangement entails advantages to the effect that despite the small thickness of the gain region the radiation can be coupled out over a comparatively much larger cross-sectional area.

There may be cases where the demand is made that the extension of the gain regions should remain below given limit values to permit e.g. an improved heat discharge or dissipation. To comply with such a demand, a separate gain region is respectively arranged in the area of individual folding elements.

To achieve an additional beam shaping, in particular for influencing the divergence angle, individual surfaces of the reflecting surfaces may be provided with an additional curvature.

For the construction of a ring resonator at least three suitably positioned folding elements that are aligned with one another may be provided.

Furthermore, a gain medium may be arranged in parallel with the reflecting surfaces of at least part of the folding elements. This has also the advantage that the beam filamentation can be reduced in the gain regions.

In combination with a resonator arrangement in which at least one of the folding elements is provided with a plane-parallel layer which is partially transparent for the radiation, this plane-parallel layer can be formed by a further boundary surface between media having different refractive indices.

For a full understanding of the present invention, reference should now be made to the following detailed description of the preferred embodiments of the invention as illustrated in the accompanying drawings.

DESCRIPTION OF THE PREFERRED EMBODIMENT

Figure 1:
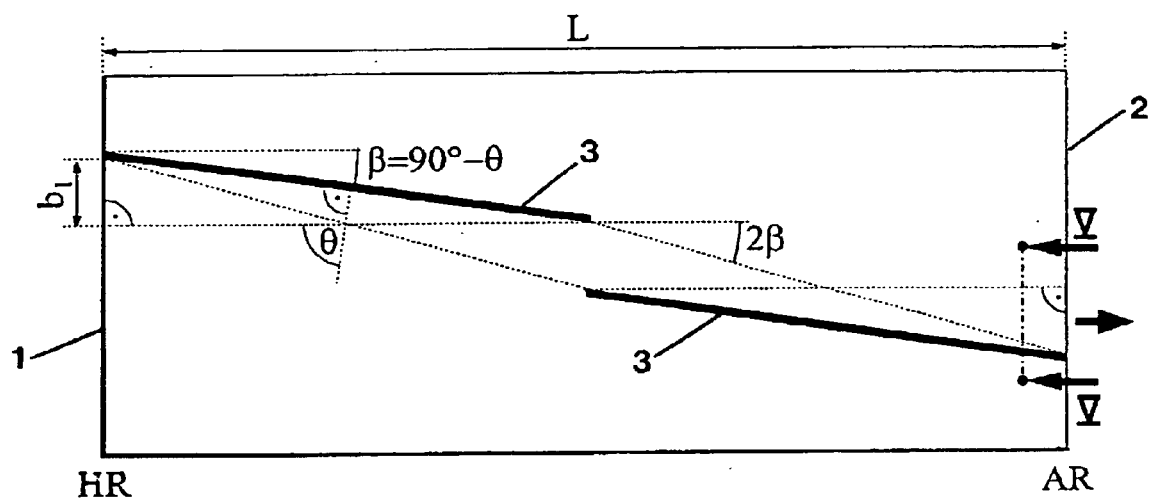
FIG. 1 shows a resonator arrangement in the form of a linear resonator with a double folding, the folding being achieved by the internal total reflection of a corresponding refractive index profile.

The preferred embodiments of the present invention will now be described with reference to FIGS. 1–16 of the drawings. Identical elements in the various figures are designated with the same reference numerals.

The basic idea of the resonator structure as shown in the below-described figures consists in that the resonator is folded by means of at least two optical elements or reflecting surfaces, the folding elements being designed such that their reflectivity shows a defined and strong angular dependence.

FIG. 1 shows a resonator of a resonator length L that is defined by the distance of the two resonator end mirrors 1, 2. This resonator is folded by two folding elements 3. A linear double-folded resonator of a "Z-geometry" is obtained due to the positioning of said two folding elements 3 within the resonator. The field of radiation within the resonator of FIG. 1 consists of portions propagating in parallel with the optical axis, and of portions propagating because of the total reflection on the folding elements 3 or the corresponding reflecting surfaces at twice the angle of reflection relative to the resonator axis. To ensure that only the rays extending in parallel with the optical axis impinge on the output coupler or resonator end mirror 2, which is provided with a partially antireflecting coating, the totally reflecting boundary surfaces are only formed over a correspondingly given part of the resonator length, as can also be seen in FIG. 1.

Figure 2A:
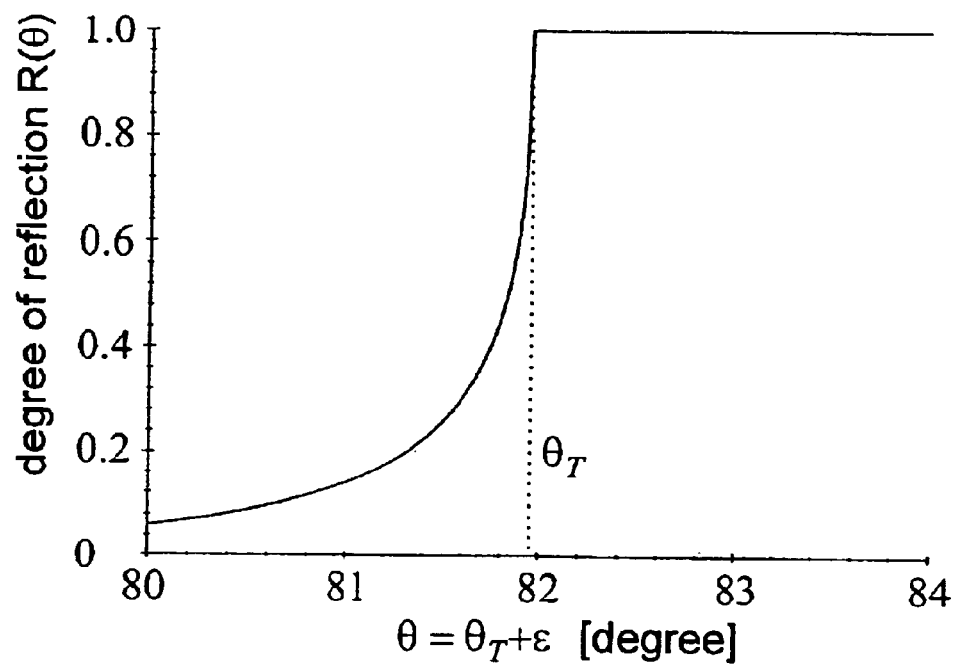
FIG. 2A shows an exemplary diagram of a degree of reflection in dependence upon the angle of incidence.
Figure 2B:
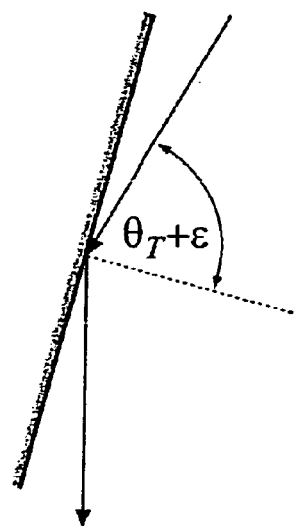
FIG. 2B shows the angle of incidence as plotted on the x-axis of the diagram of FIG. 2A.

A look at the graphic illustration of FIG. 2A reveals that the boundary surface has a strongly angle-dependent reflectivity for angles of incidence near the critical angle for total reflection. Here, q represents the angle of reflection, qT designates the critical angle for total reflection which according to the graphic illustration in FIG. 2A is 82 degrees for an assumed reflecting layer, and e designates the difference between q and qT. The angle qT+e is once again illustrated in FIG. 2B.

As can be seen in FIG. 2A, whenever the folding of a resonator, as is also illustrated in FIG. 1, is designed such that the resonator axis and the surface normal to the folding surface are at an angle relative to each other that is slightly greater than the critical angle for the total reflection, the divergence angle of the laser beam is restricted at one side around the resonator axis due to total reflection. In the case of a linear resonator, the beam is reflected on the resonator mirror 1 (see FIG. 1) and the divergence angle of the beam is thereby reflected with respect to the resonator axis. Therefore, the angle of reflection towards the other side is restricted by the total reflection for the returning beam. Hence, the total reflection which takes place twice permits the selection of the allowable divergence angle around the resonator axis.

It should here be noted that in the drawings on the respective mirrors, also on the resonator mirrors 1 and 2, the indication "HR" always means "highly reflecting" while the indication AR" always stands for "antireflecting".

Figure 3A:
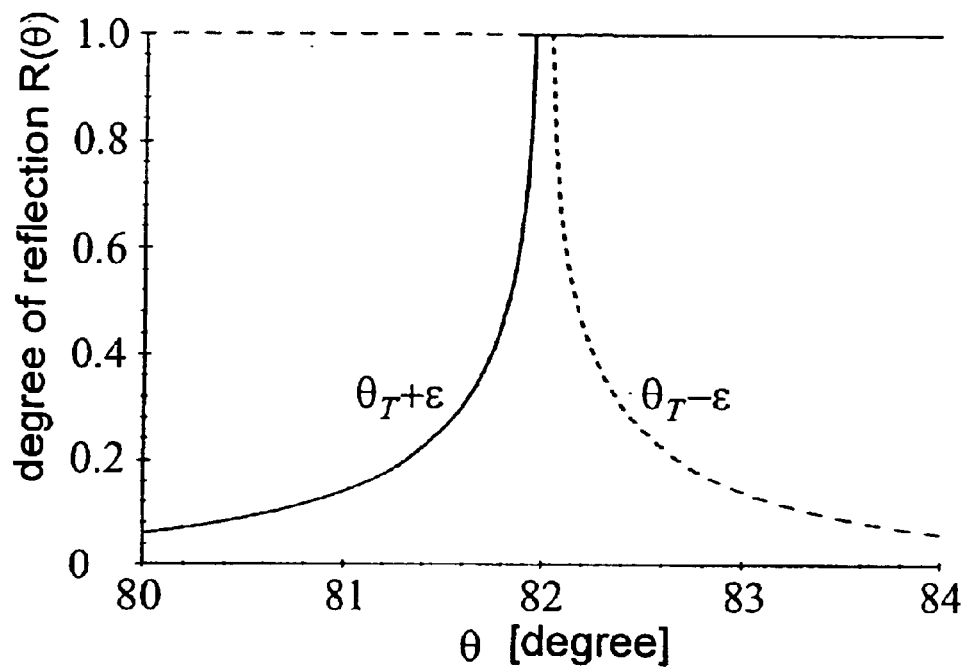
FIG. 3A shows a diagram regarding dependence upon the degree of reflection for a linear resonator with double folding.
Figure 3B:
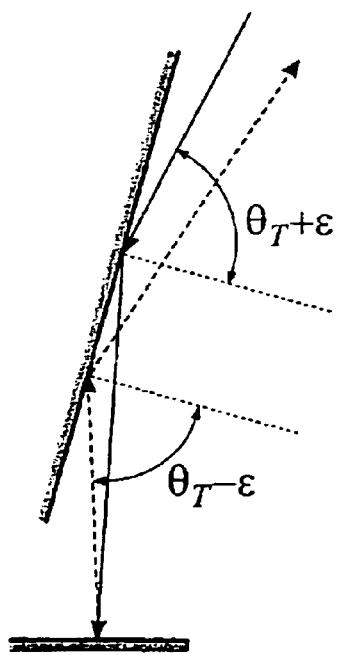
FIG. 3B indicates the beam path for half a resonator travel with double reflection on one of the folding elements.

As becomes apparent from FIGS. 3A and 3B, the reflection for the laser beams in parallel with the resonator axis becomes maximum whereas the radiation having a direction differing from the resonator axis shows higher transmission losses.

The radiation field in resonator 1 consists of portions propagating in parallel with the optical axis, and of portions which due to the total reflection on the folding surfaces propagate at twice the angle of reflection relative to the resonator axis.

Figure 4A:
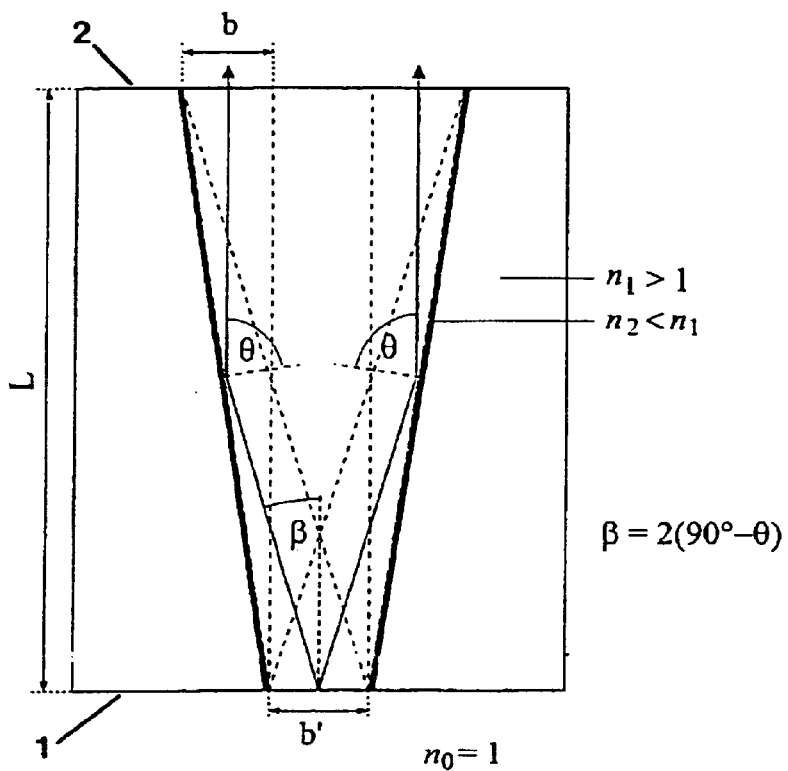
FIG. 4A shows the schematic structure of a resonator which is folded three times.

It is possible to construct resonators with a triple folding, the end surfaces of the resonators being positioned in one plane. FIG. 4A shows a resonator of a length L with two resonator end mirrors 1, 2, where the one resonator end mirror 1 is also employed as a folding element, the angle of incidence or exit being designated as b. The two further mirror elements 3 are oriented relative to the resonator end surface 1 such that an angle of reflection q is obtained. The radiation is coupled out with a, beam width o on the second resonator mirror 2, which is provided with an antireflecting coating.

Figure 4B:
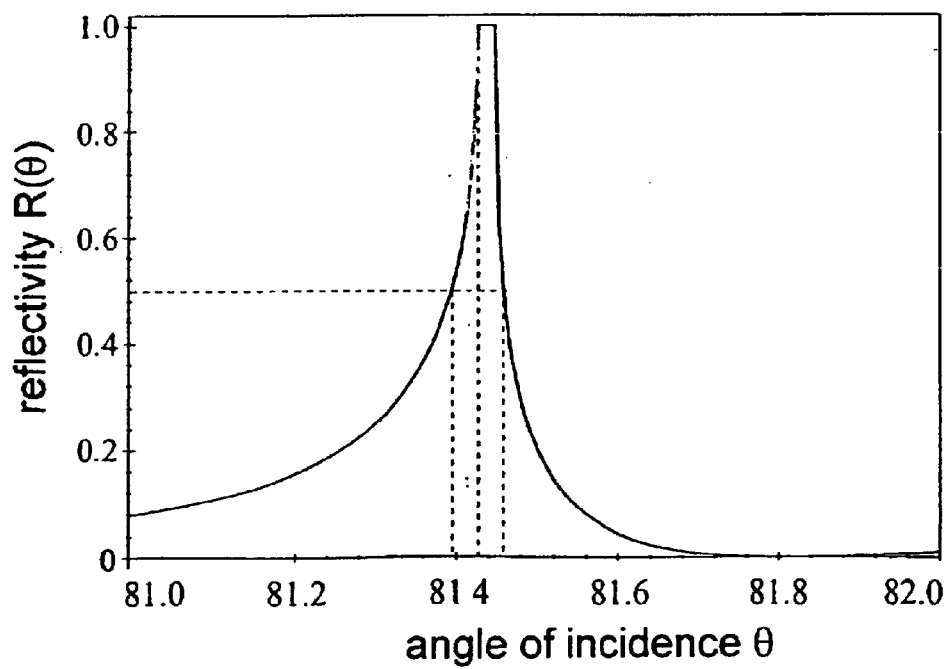
FIG. 4B shows the dependence of the reflectivity upon the angle of incidence for one travel in the resonator shown in FIG. 4A.

The total reflection degree of the arrangement in FIG. 4A follows from FIG. 4B. As can be seen in FIG. 4B, in this arrangement, too, a high degree of total reflection and thus small travel losses are only observed within a strongly reduced angular range.

Figure 5:
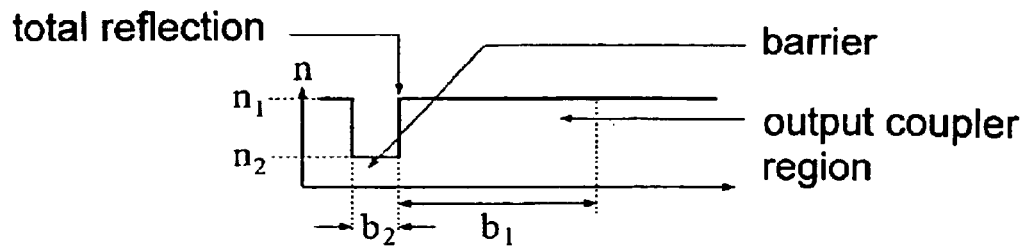
FIG. 5 schematically shows a section taken along the a sectional line V—V in FIG. 1.

FIG. 5, which shows a section taken along sectional line V—V of FIG. 1, illustrates an arrangement which has been changed in comparison with FIG. 1 in such a way that semiconductor materials are now used. The embodiment shown in FIG. 5 is an example of a monolithic laser, such as a diode layer. In accordance with FIG. 1, the resonator consists of a highly reflecting mirror and a partially transmissive output coupler. The semiconductor material has a refractive index n1. The folding areas are however realized by the boundary surfaces relative to a semiconductor material with a refractive index n2<n1, as can be seen in FIG. 5.

Normally, the semiconductor materials used in the construction of diode lasers have refractive indices considerably higher than 1 (about>>3.2 to 3.7). The critical angle for the total reflection on the outer surface of the semiconductor crystal is therefore small. Thus a diode laser resonator which is folded three times can also be realized, including a crystal outside surface, in such a way that both end mirrors of the resonator rest on a front crystal surface as outlined in FIG. 4A, when the respectively indicated refractive indices n1, n2 and n0 are there taken into account, with the provison that n1 >1, n2<n1 and n0=1, where n0 is the refractive index of the surrounding atmosphere.

A problem arising in high-gain lasers, in particular diode lasers, consists in the formation of filaments because of the charge carrier density dependence of refractive index and gain. This results in an inhomogeneity of the refractive index and gain, thereby reducing the achievable beam quality. A reduced filamentation can be achieved by exchanging the laser radiation in a direction transverse to the resonator axis by suitable mechanisms. This can e.g. be accomplished by providing the folding elements with an additional plane-parallel layer which is transparent for the impinging radiation and transports part of the radiation—like in a wave guide—along the folding elements and thus in a direction transverse to the resonator axis.

Figure 6:
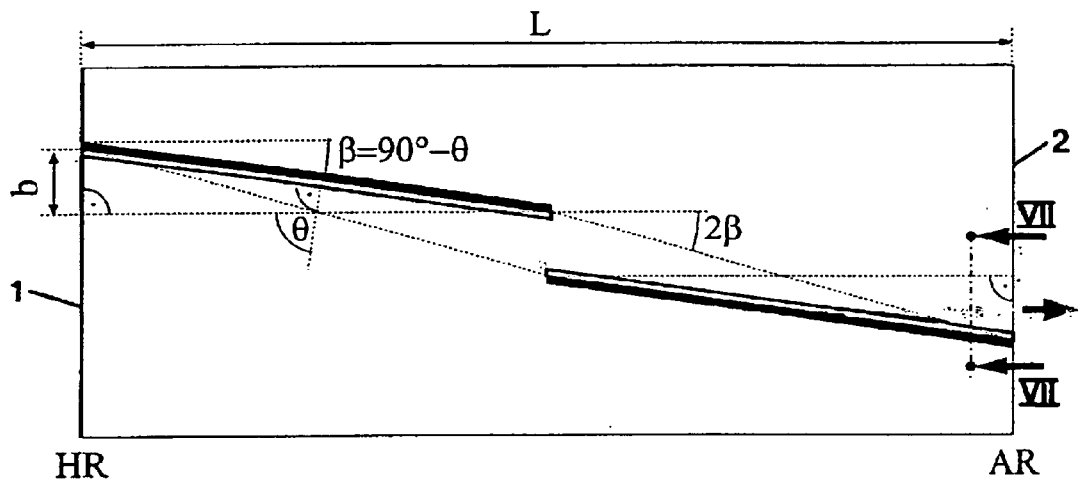
FIG. 6 schematically shows a double-folded resonator in which the refractive index on the respective folding element has three steps, resulting in the formation of a plane-parallel layer relative to the folding element.

FIG. 6 now shows an arrangement in which, in comparison with the arrangement in FIG. 1, the folding elements are provided with an additional plane-parallel layer.

Figure 7:
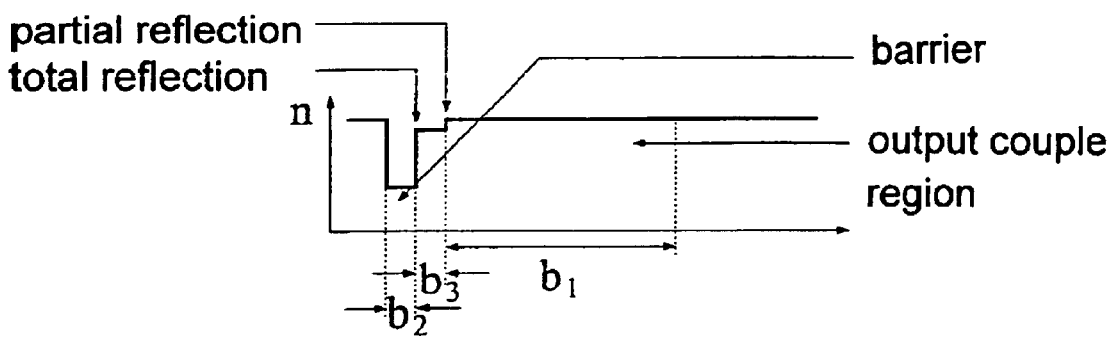
FIG. 7 schematically shows a section taken along the sectional line VII—VII in FIG. 6.

As can be seen in FIG. 7, which shows a section taken along the sectional line VII—VII in FIG. 6, the plane-parallel layer can be realized, for instance in the case of a semiconductor laser, by an additional step in the refractive index profile.

Figure 8:
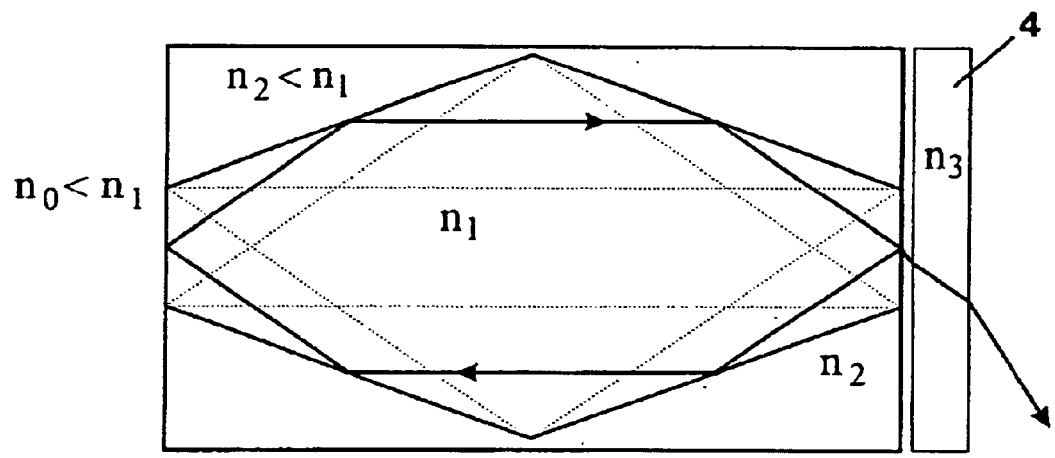
FIG. 8 schematically shows a ring resonator which is folded six times, the radiation being coupled out by leakage radiation in an outer plate.
Figure 9:
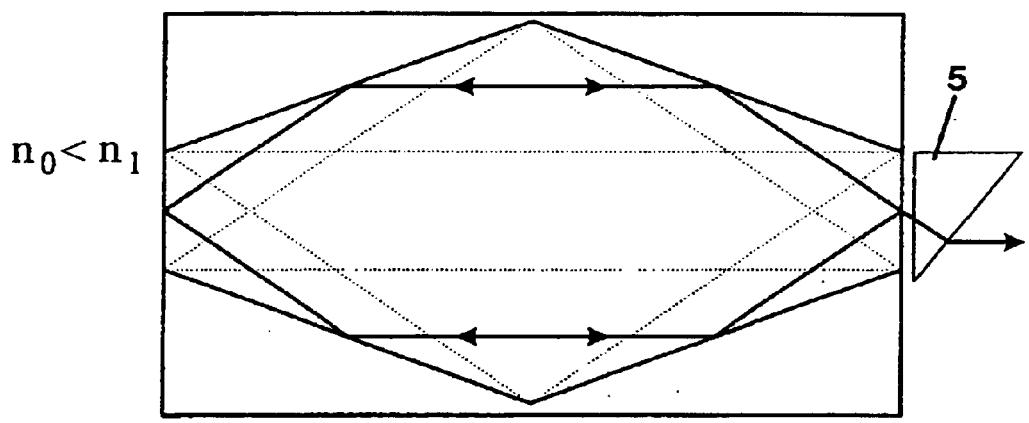
FIG. 9 shows a resonator which is folded six times in accordance with FIG. 8, the radiation being however coupled out by leakage radiation in a prism.
Figure 10:
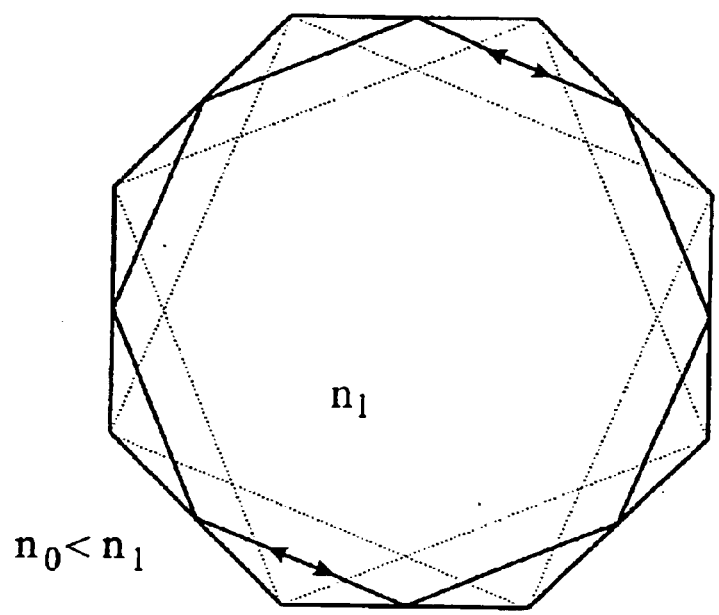
FIG. 10 schematically shows a ring resonator which is folded eight times.
Figure 11:
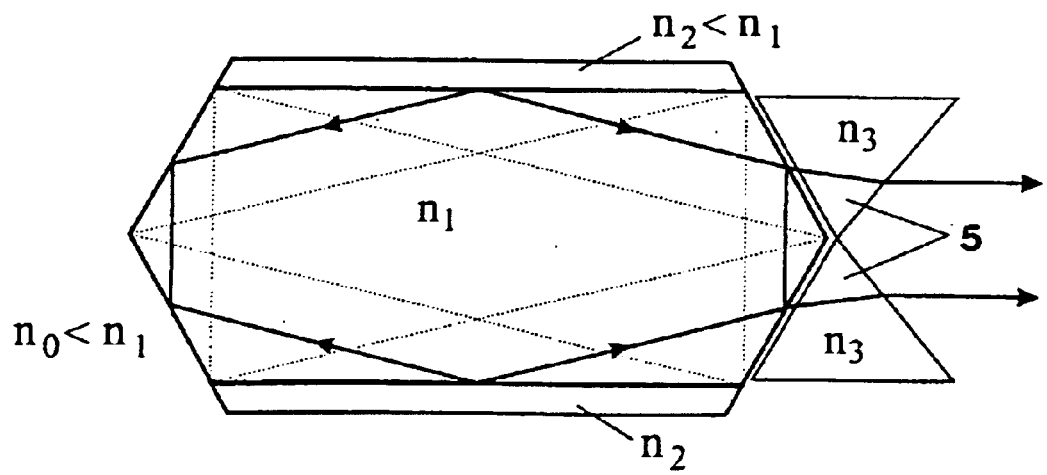
FIG. 11 schematically shows a ring resonator which is folded six times, comparable to the arrangement of FIG. 9, but with a parallel output coupling via two prisms.
Figure 12:
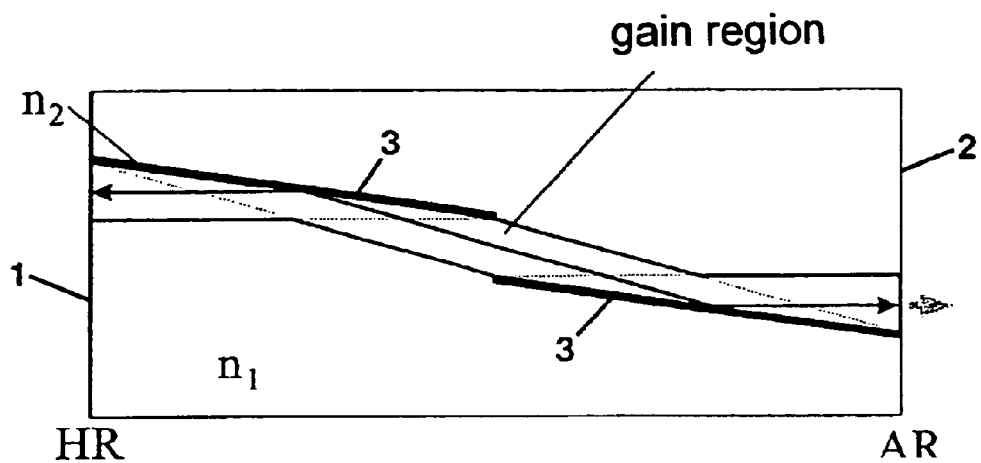
FIG. 12 is an exemplary view showing the geometry of the gain region (gain zone) for a resonator which is folded two times, as is shown by way of example in FIG. 6.

To avoid spatial hole burning, a ring resonator with a traveling wave may be constructed using respective folding elements for limiting the divergence angle of the radiation. Two exemplary arrangements are shown in FIGS. 8 and 9. The boundary surfaces of the laser medium are designed such that all edge surfaces are totally reflecting for the laser radiation. The laser radiation is coupled out via a plane-parallel plate 4 (FIG. 8) or a prism 5 (FIG. 9), each being positioned relative to the laser medium in such a manner that the laser radiation can be coupled out through leakage radiation. Furthermore, beam propagation of the laser medium in a traveling direction can be achieved by applying magnetic fields. For telecommunications or for applications where a high rate of integration is desired, microlasers with a low threshold are of great interest to the laser operation. Accordingly, microlasers with a circular or elliptical resonator are of interest. Although, when compared with microlasers with a circular resonator, microlasers with an elliptical resonator have a considerably reduced threshold and achieve a higher output power, the radiation characteristics of such microlasers are not adequate for many applications. To circumvent this problem, use is therefore preferably made of polygonal resonators for such cases, the resonator being schematically shown by way of example in FIG. 10. The resonator concerned is here a ring resonator in which the angle selection of the laser radiation is enhanced by the internal total reflection. In the example of the ring resonator as is shown in FIG. 11, the laser radiation is coupled out by two prisms (with the refractive index n3) which are designed and arranged with respect to the refractive index and the dimensions in such a manner that the radiation is coupled out via leakage radiation and, moreover, the radiations of the two directions of travel pass across the two prisms 5 in parallel with each other.

In the folded resonators as have been described above, the directional selection can additionally be supported by a suitable geometry of the excited zone (gain region). One possibility consists in adapting the gain region to the beam path which is angled due to the reflection on the folding elements 3, by the measure that only the volume is designed as a gain region through which rays are traveling that impinge in a direction perpendicular to the output mirror. The rays following the folding may here have a maximum gain, whereas all of the remaining rays are attenuated in the non-excited regions. Moreover, such a measure improves the efficiency of the resonator arrangement or of the laser because the excitation and mode volumes are approximately the same. In the case of diode lasers the geometry of the gain region can e.g. be determined by the form of the electrical contacts.

Figure 13:
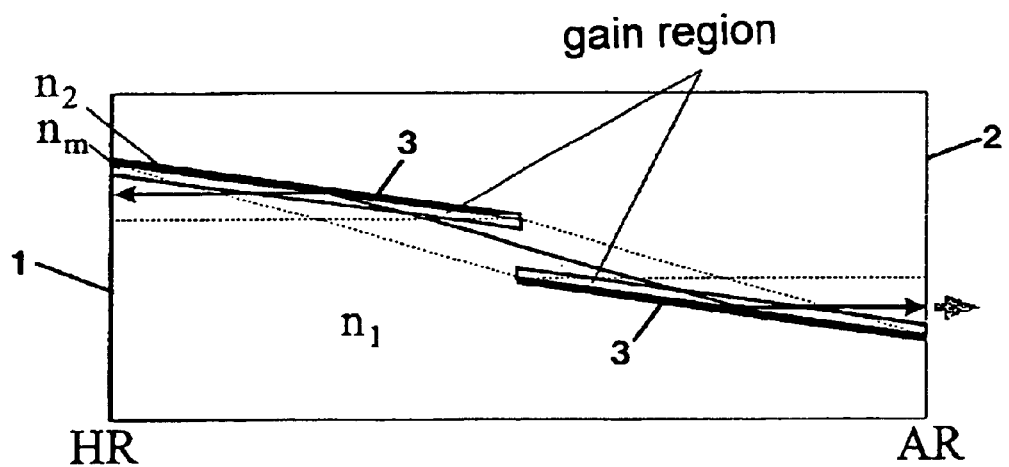
FIG. 13 shows a further resonator which is folded two times, in a schematic illustration, with striped gain regions.

FIG. 13 shows a resonator arrangement in which the gain is concentrated on small stripes in front of the folding elements 3. To this end, in accordance with the construction of FIG. 6, a plane-parallel layer is provided and assigned to the folding elements, the layer being however designed in the embodiment of FIG. 13 as a gain zone. In particular in combination with diode lasers which are constructed according to this principle, the influence of the filamentation can be reduced. Furthermore, the radiation is coupled out in this instance across an area which is large in comparison with the cross section of the gain areas, whereby the intensity load on the exit area can be reduced.

Figure 14:
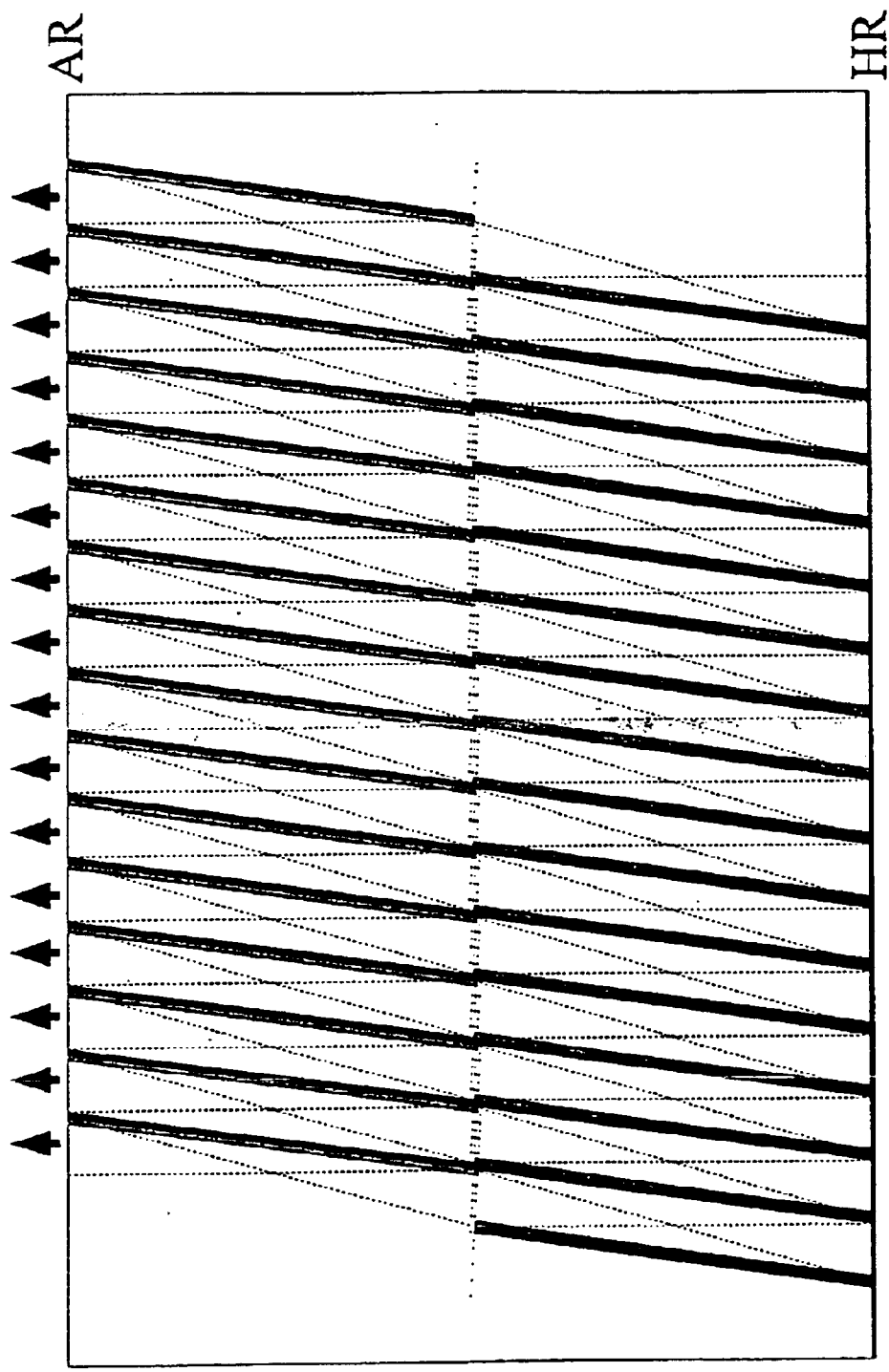
FIG. 14 shows a field or array consisting of double-folded resonators.

FIG. 14 shows an arrangement in which a plurality of folding arrangements, as are e.g. shown in FIG. 1 or 13, can be combined to form a field or array for increasing the output power. If the gain is only observed in small stripes, as is e.g. shown in the arrangement of FIG. 13, a fill factor of the array of almost 1 can be achieved due to the reduced thermal load with the array shown in FIG. 14.

Figure 16:
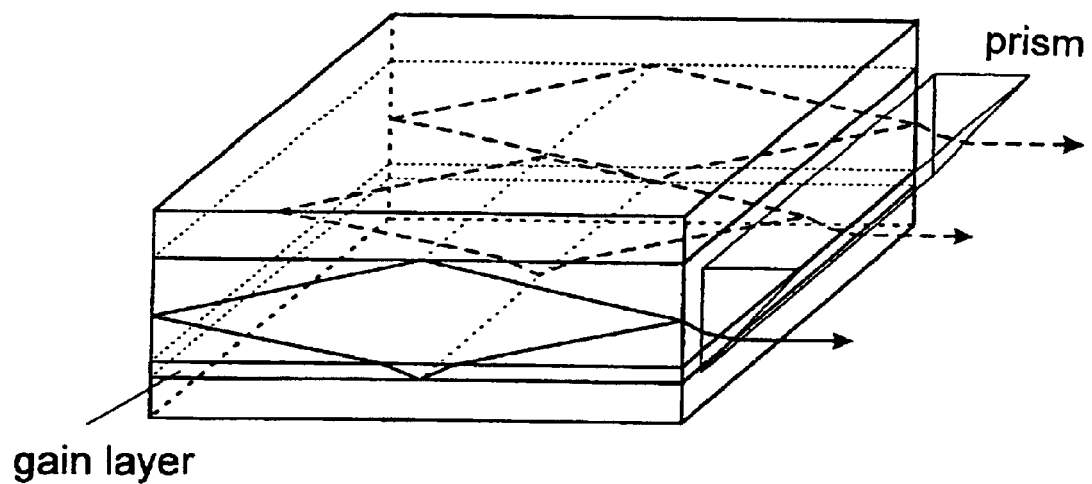
FIG. 16 schematically shows a resonator for a layered gain zone with a folding in the plane perpendicular to the gain layer.

In cases where the gain zone is designed in the manner of a thin layer, as e.g. in a semiconductor laser, the folding can also be realized in the plane perpendicular to the gain layer. In diode lasers the gain layers can be realized in the same way as in edge emitters or surface emitters. An embodiment of such a laser is shown in FIG. 16. In the arrangement of FIG. 16, the gain is achieved in a continuous gain layer while the angle-selective folding takes place on the boundary surface towards the media at refractive indices $n0<n1$ and $n2<n1$.

In comparison with normal edge emitters where the exiting beam has a beam height of 1 $\mu$m (in relation to the diode laser), an exit beam height of a few $\mu$m to a few 100 $\mu$m can be achieved by increasing the height of the resonator formed in this way. The intensity load on the exit surface is thereby reduced considerably and the limit of performance determined by the destruction threshold thereof is thereby increased.

Figure 15:
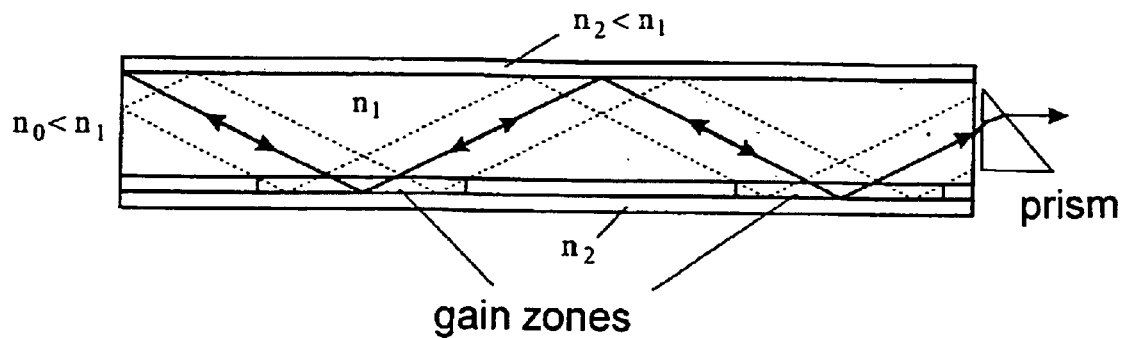
FIG. 15 shows a resonator with a folding in the plane perpendicular to the layer plane, the resonator comprising a plurality of axially arranged gain zones.

If higher gain factors are required, several gain zones may be axially arranged one after the other, as shown in FIG. 15. The gain zones may be positioned on the bottom and/or top side of the radiation guiding region.

For enhancing the output power the above-explained resonators may be arranged with corresponding gain zones in the form of an array, as is explained in fig. 14 with reference to an array which consists of individual, linear, optical resonators having a double folding.

There has thus been shown and described a novel resonator system with at least two folding elements which fulfills all the objects and advantages sought therefor. Many changes, modifications, variations and other uses and applications of the subject invention will, however, become apparent to those skilled in the art after considering this specification and the accompanying drawing which discloses the preferred embodiment thereof. All such changes, modifications, variations and other uses and applications which do not depart from the spirit and scope of the invention are deemed to be covered by the invention, which is to be limited only by the claims which follow.

What is claimed is:

1. A resonator arrangement comprising at least two folding elements for folding the beam path, said folding elements serving to restrict the divergence angle of the radiation, wherein
the respective folding is caused by reflection on a reflecting surface of the respective folding element, the beam axis of the radiation and the surface normal of the respective reflecting surface being positioned at an angle relative to each other that is greater than the critical angle for the total reflection but smaller than the sum of the critical angle for the total reflection plus the divergence angle of the radiation.

2. The resonator arrangement according to claim 1, wherein the respective reflecting surface is formed by a boundary surface between materials having different refractive indices.

3. The resonator arrangement according to claim 1, wherein in said resonator arrangement a wave guiding is carried out at least in part by way of a waveguide structure, and that the respective reflecting surface is formed by changing the profile of said waveguide structure.

4. The resonator arrangement according to claim 1, wherein at least said folding elements are arranged relative to one another such that a resonator end mirror and a resonator output coupler are positioned in one plane.

5. The resonator arrangement according to claim 1, wherein at least one of the folding elements is provided with a plane-parallel layer which is partially transparent for the radiation.

6. The resonator arrangement according to claim 1, wherein the gain region only occupies part of the resonator volume formed by simple or multiple folding.

7. The resonator arrangement according to claim 1, wherein regions which are positioned in the resonator volume and are not designed as a gain zone are provided with additional absorption.

8. The resonator arrangement according to claim 1, wherein a gain zone is provided which is layered, and that folding is carried out in a plane perpendicular to the layer.

9. The resonator arrangement according to claim 1, wherein a separate gain region is respectively arranged in the area of individual folding elements.

10. The resonator arrangement according to claim 1, wherein at least one of said reflecting surfaces is curved.

11. The resonator arrangement according to claim 1, wherein at least three folding elements are provided which are arranged such that a ring resonator is formed.

12. The resonator arrangement according to claim 1, wherein a gain medium is arranged in parallel with said reflecting surfaces of at least part of said folding elements.

13. The resonator arrangement according to claim 1, wherein the plane-parallel layer is formed by a further boundary surface between media having different refractive indices.

* * * * *